US006841956B2

(12) United States Patent
Hazelton et al.

(10) Patent No.: US 6,841,956 B2
(45) Date of Patent: Jan. 11, 2005

(54) ACTUATOR TO CORRECT FOR OFF CENTER-OF-GRAVITY LINE OF FORCE

(75) Inventors: Andrew J. Hazelton, San Carlos, CA (US); Shigeki Kageyama, Fukaya (JP); Hidehiro Chida, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/244,893

(22) Filed: Sep. 17, 2002

(65) Prior Publication Data

US 2004/0051402 A1 Mar. 18, 2004

(51) Int. Cl.[7] .............................................. H01L 21/00
(52) U.S. Cl. ........................... 318/135; 310/12; 355/53; 355/72
(58) Field of Search ........................... 310/12; 318/135; 355/53, 72

(56) References Cited

U.S. PATENT DOCUMENTS

| | | | | |
|---|---|---|---|---|
| 3,812,412 A | * | 5/1974 | Hahn et al. .................. | 318/577 |
| 4,700,189 A | * | 10/1987 | Welburn ................ | 340/870.35 |
| RE34,674 E | | 7/1994 | Beakley et al. ................ | 310/12 |
| 5,519,266 A | | 5/1996 | Chitayat ....................... | 310/12 |
| 5,708,332 A | * | 1/1998 | Bottger et al. ................. | 318/45 |
| 5,854,671 A | * | 12/1998 | Nishi ........................... | 355/53 |
| 5,905,255 A | | 5/1999 | Wakabayashi et al. ... | 250/201.5 |
| 5,969,800 A | * | 10/1999 | Makinouchi .................. | 355/53 |
| 6,144,118 A | * | 11/2000 | Cahill et al. .................. | 310/12 |
| 6,341,007 B1 | * | 1/2002 | Nishi et al. .................... | 355/53 |
| 6,441,514 B1 | * | 8/2002 | Markle ......................... | 310/12 |
| 6,570,645 B2 | * | 5/2003 | Korenaga et al. ............. | 355/75 |

* cited by examiner

*Primary Examiner*—Thanh Lam
*Assistant Examiner*—Judson H. Jones
(74) *Attorney, Agent, or Firm*—Ritter, Lang & Kaplan LLP

(57) ABSTRACT

Methods and apparatus for adjusting a push point of an actuator such that the push point more closely corresponds to a center-of-gravity of a stage being driven by the actuator are disclosed. According to one aspect of the present invention, a method for scanning a stage device which includes a stage, as well as an actuator which has a first coil and a second coil, includes driving the stage using the actuator and determining when driving the stage using the actuator includes driving the stage through a first location associated with the stage. The actuator is arranged to drive the stage through a push point associated with the first coil and the second coil. The method also includes altering the push point when it is determined that driving the stage using the actuator does not result in the stage being driven through the first location associated with the stage.

55 Claims, 11 Drawing Sheets

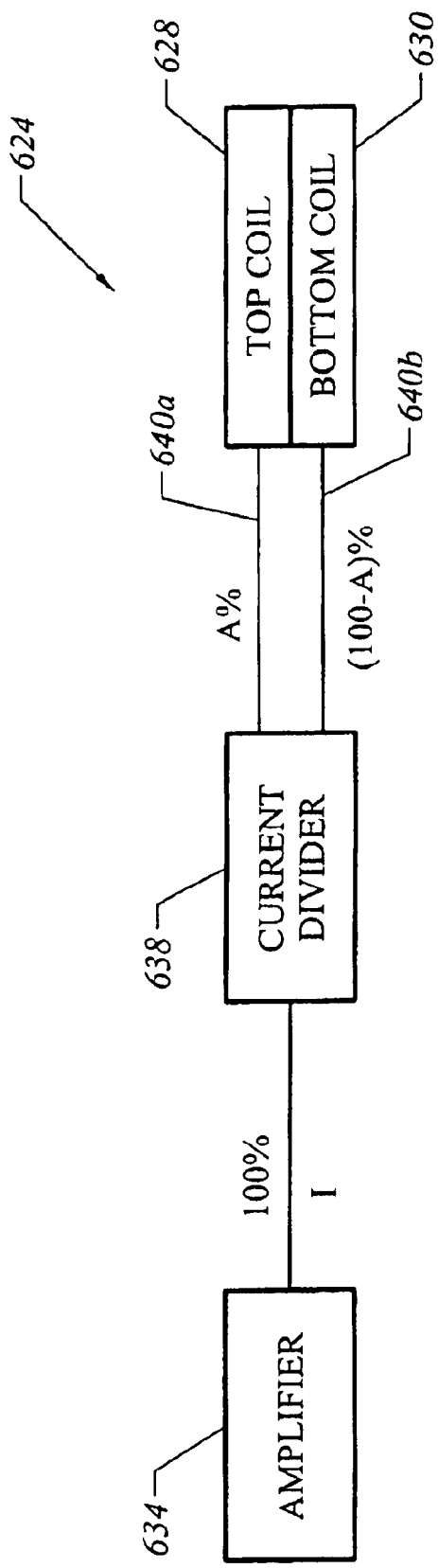
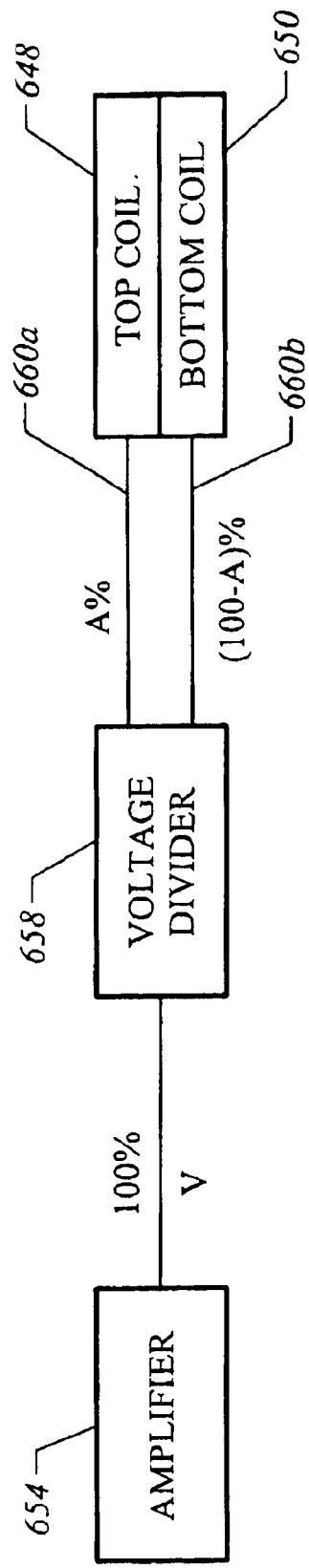
*FIG. 6B*
*FIG. 6C*

ACTUATOR TO CORRECT FOR OFF CENTER-OF-GRAVITY LINE OF FORCE

BACKGROUND OF THE INVENTION

1. Field of Invention

The present invention relates generally to semiconductor processing equipment. More particularly, the present invention relates to a mechanism which enables an actuator push point to be efficiently adjusted to minimize pitching moments associated with a stage apparatus.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by pitching moments, products formed using the precision instrument may be improperly formed and, hence, function improperly. For instance, a photolithography machine which is subjected to pitching moments may cause an image projected by the photolithography machine to move, and, as a result, be aligned incorrectly on a projection surface such as a semiconductor wafer surface.

Scanning stages such as wafer scanning stages and reticle scanning stages are often used in semiconductor fabrication processes, and may be included in various photolithography and exposure apparatuses. Wafer scanning stages are generally used to position a semiconductor wafer such that portions of the wafer may be exposed as appropriate for masking or etching. Reticle scanning stages are generally used to accurately position a reticle or reticles for exposure over the semiconductor wafer. Patterns are generally resident on a reticle, which effectively serves as a mask or a negative for a wafer. When a reticle is positioned over a wafer as desired, a beam of light or a relatively broad beam of electrons may be collimated through a reduction lens, and provided to the reticle on which a thin metal pattern is placed. Portions of a light beam, for example, may be absorbed by the reticle while other portions pass through the reticle and are focused onto the wafer.

To reduce pitching moments which arise within a photolithography or exposure apparatus and, hence, to increase the accuracy with which a photolithography process or an exposure process may occur, the apparatus may be designed such that an actuator which drives a stage of the apparatus has a push point of center of force which is approximately in the same plane as the center-of-gravity of the stage. FIG. 1a is a diagrammatic representation of an overall stage apparatus. A stage apparatus 100 includes a wafer stage 104 which is arranged to perform coarse scans and a wafer table 108 which is arranged to perform fine scans. A wafer (not shown) is arranged to be held by a wafer chuck 110 which is generally supported on wafer table 108. Actuators 112 enable wafer table 108 to scan.

A magnet 116 which is generally positioned within wafer stage 104 is arranged to cooperate with a guide bar 120 to allow wafer stage 104 to scan over guide bar 120. Guide bar 120 is coupled on each end to a linear motor coil 124 which, together with a stator 128, serve as a motor which enables wafer stage 104 to scan along a z-axis 130.

When wafer stage 104 is driven using motors which include stators 128 (having a magnet or magnets) and motor coils 124, wafer stage 104 is expected to be driven through a center-of-gravity 140 of wafer stage 104 in order to substantially minimize the occurrence of pitching moments within stage apparatus 100. As such, to better enable wafer stage 104 to be driven through center-of-gravity 140, the location of the motors which include stators 128 and motor coil 124 is desired to be such that the push points associated with the motors are effectively aligned with center-of-gravity 140. When the push points associated with the motors are not in the same plane as center-of-gravity 140, e.g., the push points are below center-of-gravity with respect to a y-axis 132, then pitching moments which cause disturbances may arise.

A push point associated with a motor coil, as for example motor coil 124a, is typically located at a center of motor coil 124a. FIG. 1b is a diagrammatic representation of stator 128a and a portion of motor coil 124a of FIG. 1a. A push point 150 is effectively a center of force associated with coil 124a. Push point 150 is positioned such that force is generated on the center of coil 124a. In general, motor coil 124a may take on substantially any geometry. By way of example, motor coil 124a and stator 128a may be part of a three-phase motor such as a three-phase commutated sinusoidal motor. Connections 160 to coil 124a in a three-phase motor may be associated with a bridge, e.g., bridge 170 as shown in FIG. 1c.

In many cases, aligning motors such that push points or centers of force of the motors closely correspond to a center-of-gravity of a structure that is being driven by the motors is difficult. For instance, identifying an exact location of a center of gravity of the structure is typically difficult. As a result, a push point of an actuator and the center of gravity of a structure, e.g., a stage, that is to be driven by the actuator may be out of alignment. Often, the error in alignment between the push point of an actuator and the center of gravity of a stage may be in the range of between approximately five mm and approximately ten mm. In order to compensate for errors in alignment, masses may be added to the stage in order to effectively move the center-of-gravity of the stage to more closely correspond to the push point of the actuator. Since the masses which generally must be added to a stage in order to move the center-of-gravity of the stage by between approximately five mm and approximately ten mm are relatively large, i.e., heavy, such masses may make it more difficult for the actuator to move the stage.

Therefore, what is needed is a method and an apparatus which enables the push point of an actuator to be readily aligned with a center-of-gravity of a stage which is being driven by the actuator. That is, what is desired is a system for enabling the push point of an actuator to be shifted to coincide with a center-of-gravity of a stage substantially without requiring that masses be added to the stage to shift the center-of-gravity.

SUMMARY OF THE INVENTION

The present invention relates to adjusting a push point of an actuator such that the push point more closely corresponds to a center-of-gravity of a stage being driven by the actuator. According to one aspect of the present invention, a method for scanning a stage device which includes a stage, as well as an actuator which has a first coil and a second coil, includes driving the stage using the actuator and determining when driving the stage using the actuator includes driving the stage through a first location associated with the stage. The actuator is arranged to drive the stage through a push point associated with the first coil and the second coil. The method also includes altering the push point when it is determined that driving the stage using the actuator does not result in the stage being driven through the first location associated with the stage.

In one embodiment, driving the stage using the actuator includes providing a first input to the first coil and providing a second input to the second coil. A difference between the first input and the second input substantially defines the push point associated with the first coil and the second coil. In such an embodiment, altering the push point includes altering at least one of the first input and the second input to substantially adjust the difference between the first input and the second input.

A dual coil force actuator enables a push point associated with the force actuator to be adjusted by adjusting a relative force associated with the force actuator. By adjusting the relative magnitude of the force to the separate coils of the force actuator enables the center of force of the actuator to be shifted, e.g., to line up with a center-of-gravity of a stage being driven by the actuator. Altering a push point or center of force of an actuator rather than altering a center-of-gravity (or center of rotations) of a stage being driven by the actuator enables pitching moments within an overall stage device to be reduced without necessitating the need to add significant masses, e.g., ballast, to the stage.

According to another aspect of the present invention, a stage apparatus includes a stage which has a center-of-gravity and an actuator. The actuator includes a first coil and a second coil which are substantially separately controllable. The first coil and the second coil cooperate to define a center of force through which the stage is arranged to be driven by the actuator. In one embodiment, the first coil includes a first input and the second coil includes a second input which may be adjusted to substantially move the center of force to be approximately aligned along a common plane with the center of gravity.

In accordance with still another aspect of the present invention, an actuator includes a magnet and a coil assembly which has a first coil and a second coil. The first coil is arranged to be controlled to adjust a first amount of force associated with the first coil, and the second coil is arranged to be controlled to adjust a second amount of force associated with the second coil. The first amount of force and the second amount of force cooperate to substantially define a push point of the actuator. The magnet and the coil assembly cooperate to cause the actuator to actuate, e.g., to move a stage.

In one embodiment, the actuator also includes a first controller that adjusts the first amount of force and a second controller that adjusts the second amount of force. The first amount of force and the second amount of force are arranged to be adjusted to adjust the push point of the actuator. In such an embodiment, a difference between the first amount of force and the second amount of force substantially defines a relative force that determines a location of the push point. The difference is adjustable using at least one of the first controller and the second controller to alter the relative force and the location of the push point.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which:

FIG. 6b is a diagrammatic block diagram representation of a coil assembly of a dual force actuator which is driven by an amplifier with a current divider circuit in accordance with an embodiment of the present invention.

FIG. 6c is a diagrammatic block diagram representation of a coil assembly of a dual force actuator which is driven by an amplifier and a voltage divider circuit in accordance with an embodiment of the present invention.

DETAILED DESCRIPTION OF THE EMBODIMENTS

When a stage such as a lithography stage is not driven through approximately the center of gravity of the stage, pitching moments may be generated which may adversely affect the performance of the stage as well as the overall stage device. Therefore, many stage devices are designed to align an actuator push point, or center of force, with the center-of-gravity of the stage that is being driven by the actuator to be on the same plane in as far as possible. Often, since errors in alignment may result in between approximately a five millimeter (mm) and approximately a ten mm mismatch between the push point and the center of gravity, methods to compensate for the errors in alignment are introduced. While such methods typically involve adding adjustable masses, as for example to the stage, to move the effective center-of-gravity of the stage and may be effective, the masses are often heavy, and may cause an increased motor force and more complicated dynamics.

A force actuator such as a motor which includes two or more coils, e.g., linear motor coils, enables a center of force or a push point associated with the force actuator to be adjusted within a plane, or along an axis. By adjusting the relative force commanded to each coil included in the force actuator, as for example by adjusting the relative amplitude of current provided to the coils, the center of force may effectively be moved along an axis. Specifically, the center of force may be shifted to enable the center of force of the force actuator to more closely correspond to the center-of-gravity of the stage by adjusting the relative force commanded to each coil of a coil assembly which drives the stage. Hence, the center of force may be shifted relatively efficiently substantially without requiring the adjustment of relatively heavy masses, and substantially without the need for a relatively large adjustment stroke.

Figure 1A:
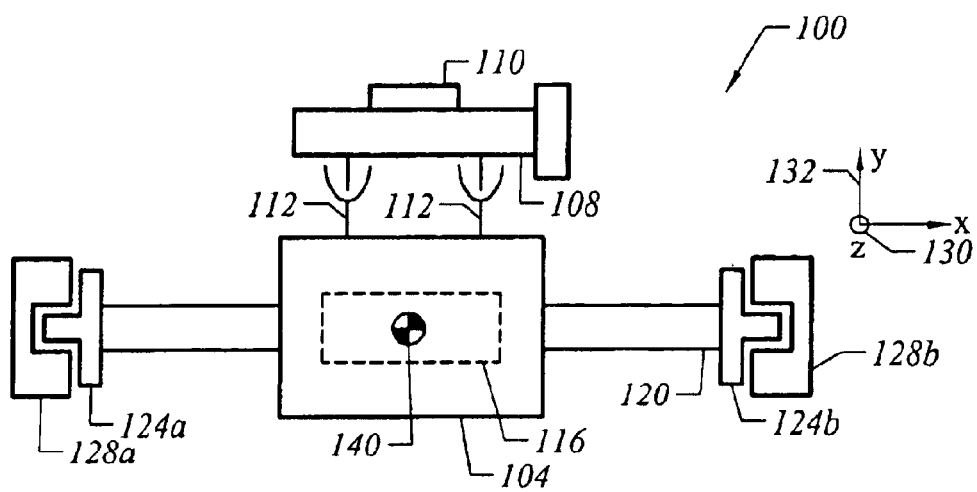
FIG. 1a is a diagrammatic representation of an overall stage apparatus.
Figure 1B:
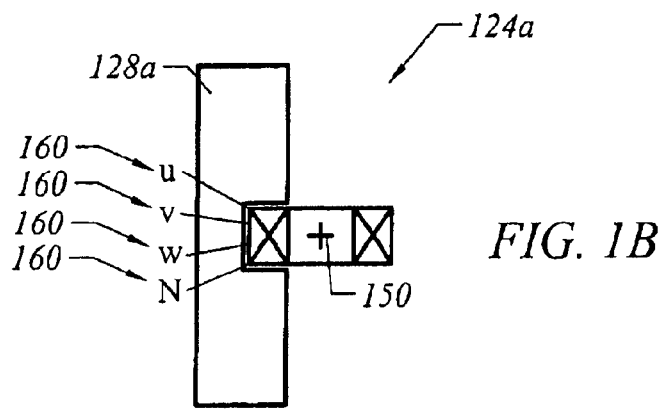
FIG. 1b is a diagrammatic representation of a stator and a portion of a motor coil, e.g., stator 128a and a portion of motor coil 124a of FIG. 1a FIG. 1c is a diagrammatic representation of a bridge of a three-phase motor.
Figure 1C:
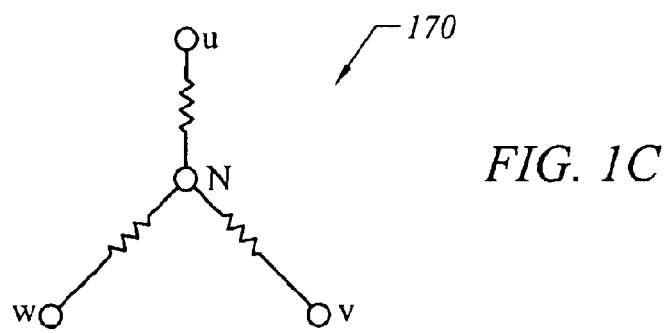
Figure 2:
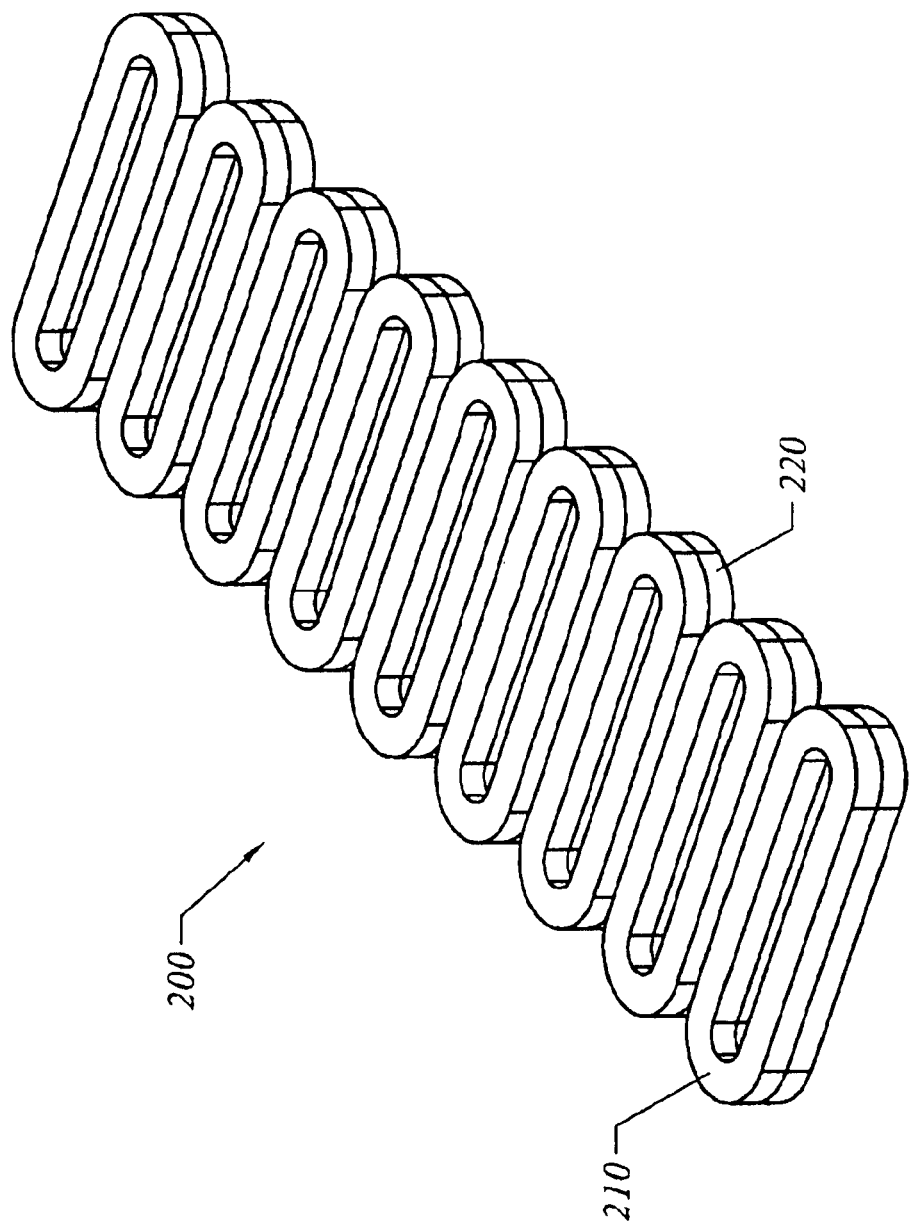
FIG. 2 is a diagrammatic representation of a coil assembly of a motor which includes more than one coil in accordance with an embodiment of the present invention.

FIG. 2 is a diagrammatic representation of a coil assembly of a motor which includes more than one coil in accordance with an embodiment of the present invention. A coil assembly 200 is generally part of a motor, e.g., a linear motor, which also includes components such as a motor cooling can and magnets. For ease of illustration, a cooling can and a magnet assembly having a magnet or magnets have not been shown. As shown, coil assembly 200 includes a top coil "half" 210 and a bottom coil "half" 220 which are in physical contact. Each of top coil 210 and bottom coil 220 generates an electromagnetic force by cooperating with the magnet assembly that is common to both top coil 210 and bottom coil 220. Top coil 210 and bottom coil 220 are substantially identical and are arranged to be commutated substantially identically. However, since top coil 210 and bottom coil 220 may be associated with different relative magnitudes of force, a center of force (not shown) associated with coil assembly 200 and, hence, the motor which includes coil assembly 200, may be adjusted.

Figure 3:
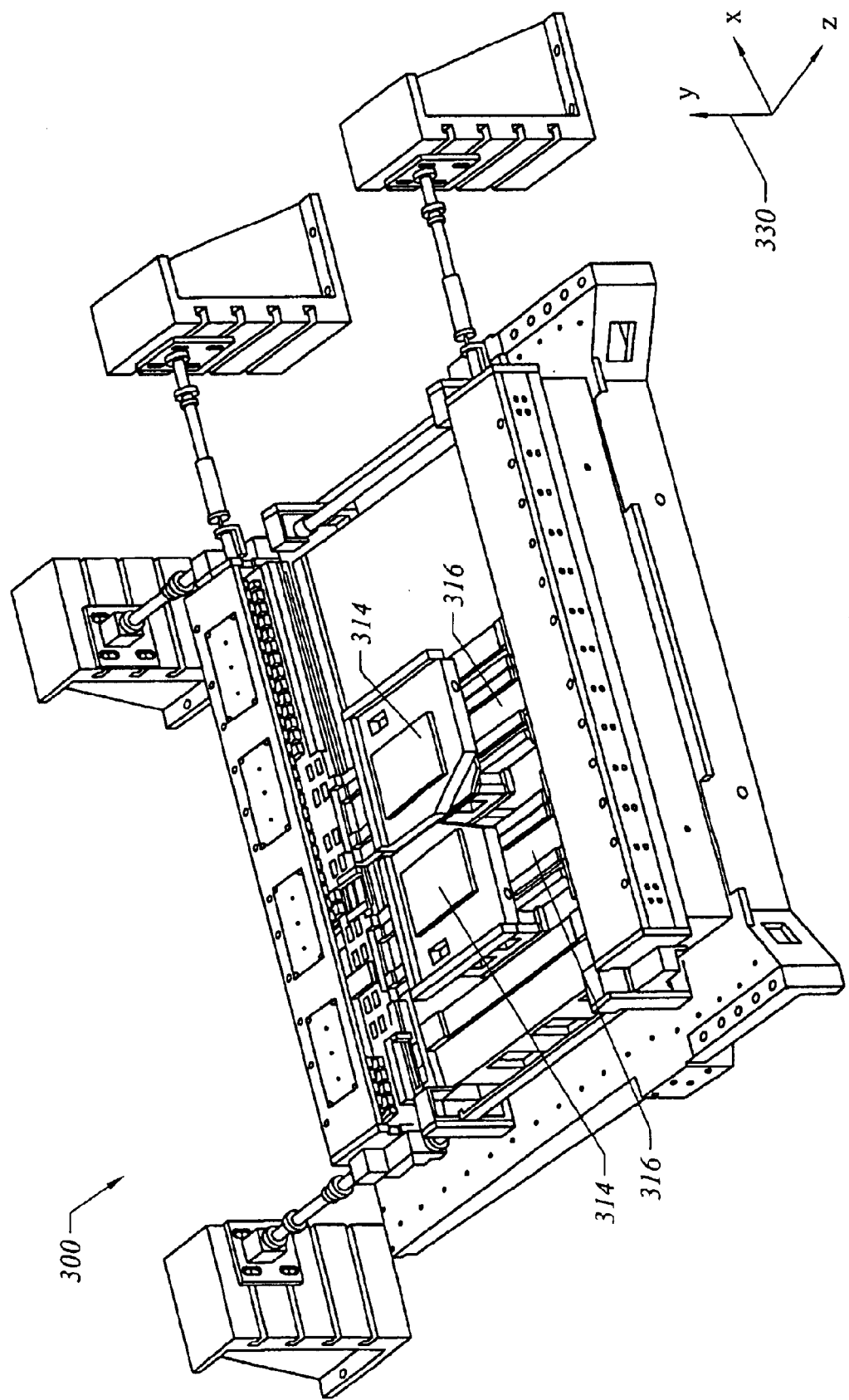
FIG. 3 is a diagrammatic representation of a scanning stage device in accordance with an embodiment of the present invention.

Typically, a coil assembly which includes more than one coil such as coil assembly 200 may be implemented for use as a part of substantially any actuator for which the potential to shift a center of force is desired. By way of example, a coil assembly which includes two or more coils may be implemented for use as a part of a scanning stage device. FIG. 3 is a diagrammatic representation of a scanning stage device in accordance with an embodiment of the present invention. As shown, a scanning stage device 300 includes stages 314. Stages 314 are arranged to be scanned using motors which include coil assemblies 316. In the described embodiment, coil assemblies 316 may each include two or more coils which have separate current or voltage inputs. Adjusting the amount of current or voltage provided to the coils of coil assemblies 316 enables a center of force or push point associated with the motor which includes coil assemblies 316 to be adjusted upwards or downwards along a y-direction 330.

Figure 4A:
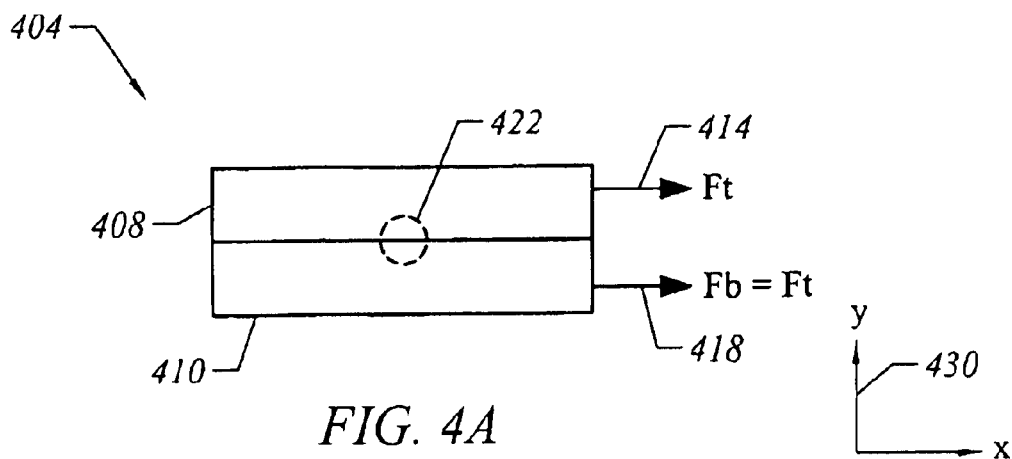
FIG. 4a is a diagrammatic block diagram representation of a coil assembly of an actuator which includes two coils that are each controlled with the same amplitude of current in accordance with an embodiment of the present invention.

In one embodiment, by adjusting the relative amplitude of current provided to coils in an actuator, the center of force of the actuator may be shifted to enable the center of force, or push point, to more closely correspond with a center-of-gravity of a stage which includes the actuator or, more generally, the structure which is being driven by the actuator. When the push point of an actuator closely corresponds to the center-of-gravity of a stage, e.g., is located less than approximately five mm from the center-of-gravity of the stage, pitching moments associated with the stage which are essentially caused by the actuator may be reduced. FIG. 4a is a diagrammatic block diagram representation of a coil assembly of an actuator which includes two coils that are each controlled with the same amplitude of current in accordance with an embodiment of the present invention. A coil assembly 404 of an actuator includes a top coil 408 and a bottom coil 410 which are arranged to be substantially separately controlled, e.g., top coil 408 and bottom coil 410 each have individual connections for receiving current. In one embodiment, top coil 408 and bottom coil 410 are substantially identical.

When the amplitude of current provided to top coil 408 is substantially the same as the amplitude of current provided to bottom coil 410, then the magnitude of force 414 imparted by top coil 408 is approximately the same as the magnitude of force 418 imparted by bottom coil 410. As such, a center of force 422 or push point associated with coil assembly 404 and, more generally, the overall actuator (not shown) which includes coil assembly 404, is substantially in the middle of coil assembly 404 relative to a y-axis 430. When center of force 422 being located substantially in the middle of coil assembly 404 allows center of force 422 to coincide with the center-of-gravity of a stage (not shown) which is driven by coil assembly 404, then the stage may be driven through its center-of-gravity substantially without causing pitching moments.

Figure 4B:
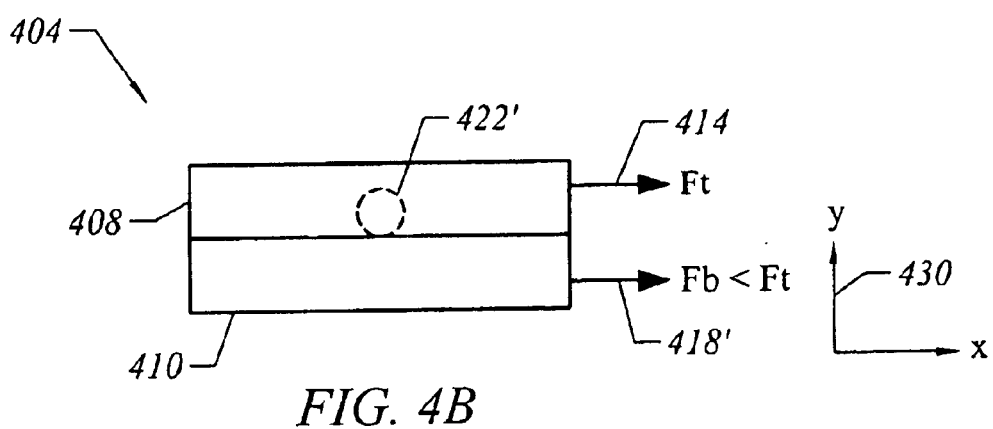
FIG. 4b is a diagrammatic block diagram representation of a coil assembly, e.g., coil assembly 404 of FIG. 4a, in which the amplitude of current provided to a top coil is greater than the amplitude of current provided to a bottom coil in accordance with an embodiment of the present invention.

Causing the relative amplitudes of current provided to top coil 408 and bottom coil 410 to be varied enables a center of force associated with coil assembly 404 to be adjusted. For example, a center of force may effectively be moved such that the center of force is raised within coil assembly 404 with respect to y-axis 430. FIG. 4b is a diagrammatic block diagram representation of a coil assembly, e.g., coil assembly 404 of FIG. 4a, in which the amplitude of current provided to a top coil is greater than the amplitude of current provided to a bottom coil in accordance with an embodiment of the present invention. When the amplitude of current provided to top coil 408 is greater than the amplitude of current provided to bottom coil 410, the magnitude of force 418' imparted by bottom coil 410 is less than the magnitude of force 414 imparted by top coil 408. As a result, a center of force 422' associated with coil assembly is shifted upwards within coil assembly 404 with respect to y-axis 430, as shown. Shifting center of force 422' upwards along y-axis 430, e.g., by up to approximately five mm or up to approximately ten mm, enables center of force 422' to more closely correspond to the center-of-gravity of a stage (not shown) when the center-of-gravity of the stage is higher than center of force 422 of FIG. 4a. The amount by which center of force 422' is shifted upwards along y-axis 430 is dependent upon the amount by which the amplitude of current provided to top coil 408 exceeds the amplitude of current provided to bottom coil 410. In general, the more the amplitude of current provided to top coil 408 exceeds the amplitude of current provided to bottom coil 410, the more center of force 422' is shifted upwards along y-axis 430.

Figure 4C:
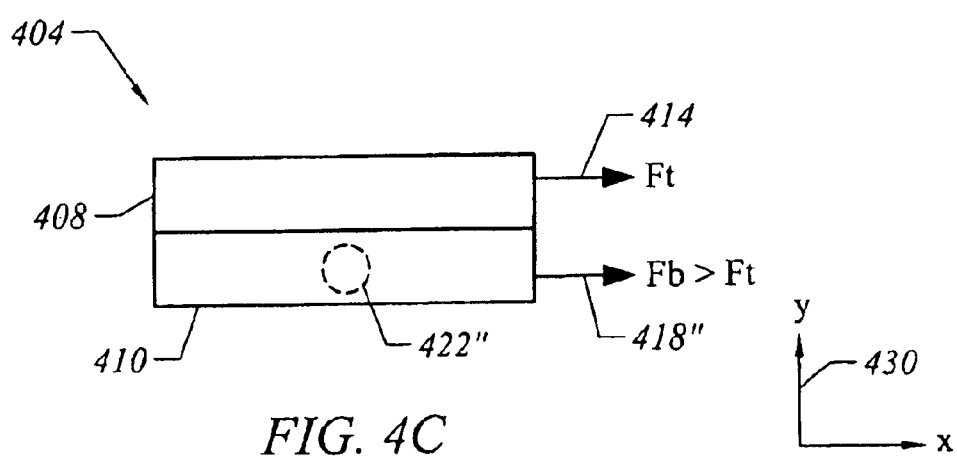
FIG. 4c is a diagrammatic block diagram representation of a coil assembly, e.g., coil assembly 404 of FIG. 4a, in which the amplitude of current provided to a top coil is less than the amplitude of current provided to a bottom coil in accordance with an embodiment of the present invention.

In lieu of shifting a center of force upwards along y-axis 430, the center of force may instead be shifted downwards along y-axis 430, as for example when the center-of-gravity associated with a stage (not shown) is lower with respect to y-axis 430 than center of force 422 of FIG. 4a. FIG. 4c is a diagrammatic block diagram representation of a coil assembly, e.g., coil assembly 404 of FIG. 4a, in which the amplitude of current provided to a top coil is less than the amplitude of current provided to a bottom coil in accordance with an embodiment of the present invention. A center of force 422" is shifted downwards with respect to y-axis 430 when the amplitude of current provided to top coil 408 is less than the amplitude of current provided to bottom coil 410. Center of force 422" shifts downward with respect to y-axis 430 due to the fact that the amplitudes of current provided to top coil 408 and bottom coil 410 are such that the magnitude of force 418" imparted by bottom coil 410 is greater than the magnitude of force 414 imparted by top coil 408.

Typically, center of force 422" may be shifted downwards along y-axis 430 relative to center of force 422 of FIG. 4a by up to approximately five mm or up to approximately ten mm. It should be appreciated, however, that the amount by which center of force 422" may shift may vary. Generally, the larger the difference in the amplitudes of currents provided to top coil 408 and bottom coil 410, the more center of force 422" is shifted downwards along y-axis 430. In addition, the thickness of top coil 408 and bottom coil 410, as measured with respect to y-axis 430, may affect the overall amount by which center of force 422 of FIG. 4a may be shifted.

Figure 5:
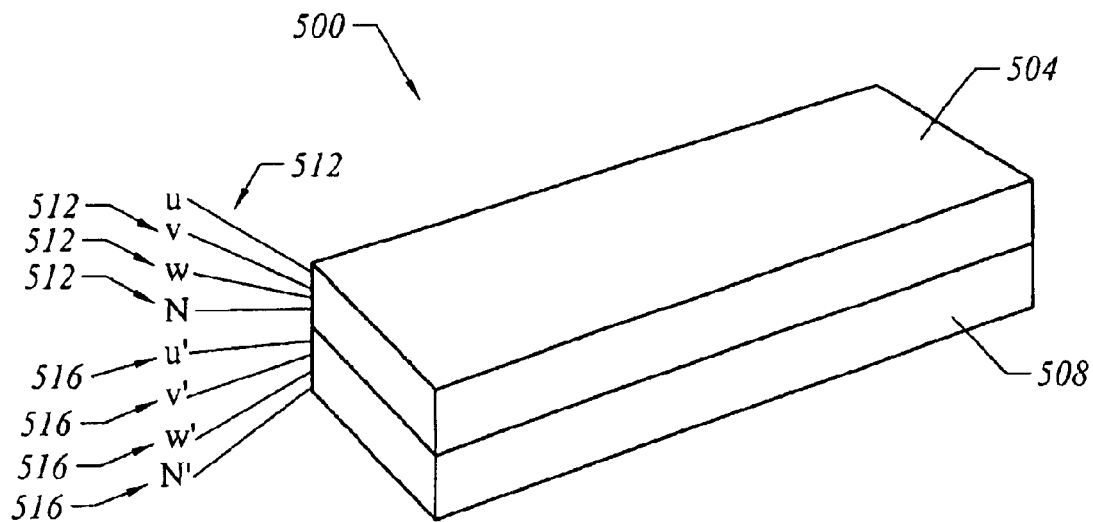
FIG. 5 is a diagrammatic representation of a coil assembly which includes two coils which each have individual connections in accordance with an embodiment of the present invention.

In order to enable coils of a dual force actuator such as a voice coil motor (VCM) or a linear motor, to receive different input currents or, more generally, different inputs, each coil of a dual force actuator may include separate connections to the rest of the dual force actuator. Referring next to FIG. 5, the connections associated with a dual force actuator will be described in accordance with an embodiment of the present invention. A coil assembly 500 of a dual force actuator includes a top coil 504 and a bottom coil 508. When coil assembly 500 is part of a three-phase motor, top coil 504 and bottom coil 508 may each have separate connections. In other words, each coil 504, 508 may be wired substantially separately such that top coil 504 includes connections 512 and bottom coil 508 includes connections 516.

Figure 6A:
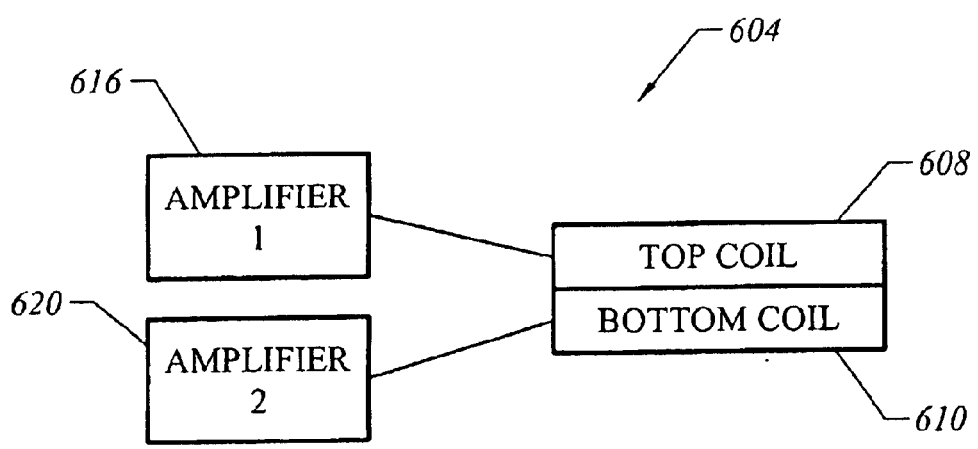
FIG. 6a is a diagrammatic block diagram representation of a coil assembly of a dual force actuator which is driven by separate amplifiers in accordance with an embodiment of the present invention.

The coils of a dual force actuator may be individually driven using substantially any suitable mechanism. Suitable mechanism include, but are not limited to, separate amplifiers, a single amplifier with a current divider circuit, and a single amplifier with a voltage divider circuit. FIG. 6a is a diagrammatic block diagram representation of a coil assembly of a dual force actuator which is driven by separate amplifiers in accordance with an embodiment of the present invention. A coil assembly 604 includes a top coil 608 and a bottom coil 610. Top coil 608 is coupled to a first amplifier 616, and bottom coil 610 is coupled to a second amplifier 620. The force generated by coil 608 may be dependent upon the amount of current provided through first amplifier 616, while the force generated by coil 610 is dependent upon the amount of current provided through second amplifier 620. The use of first amplifier 616 and second amplifier 620 enables top coil 608 and bottom coil 610 to be driven or otherwise controlled substantially independently. That is, the magnitude of force outputted from top coil 608 is substantially unaffected by the magnitude of force outputted from bottom coil 610.

FIG. 6b is a diagrammatic block diagram representation of a coil assembly of a dual force actuator which is driven by an amplifier with a current divider circuit in accordance with an embodiment of the present invention. A coil assembly 624 includes a top coil 628 and a bottom coil 630, which are each substantially coupled to outputs 640 of a current divider 638. Current divider 638 receives an input from amplifier 634 which effectively provides current divider 638 with a first amount of current. Substantially any suitable current divider 638, as for example a conventional current divider, may be used with coil assembly 624.

Current divider 638 effectively controls the distribution of force associated with coil assembly 624. That is, the relative forces commanded to top coil 628 and to bottom coil 630 may be adjusted by adjusting current divider 638. For example, current divider 638 may divide the first amount of current into a second amount, which is provided to top coil 648, and a third amount, which is provided to bottom coil 650. In other words, current divider 638 divides current provided through amplifier 634 into current components which are provided as output 640a to top coil 628 and as output 640b to bottom coil 630. Typically, if approximately one-hundred percent of a current provided by amplifier 634 is received within current divider 638, the approximately one-hundred percent of current is divided by current divider 638 such that a given percentage "A" of the approximately one-hundred percent of the current is provided to top coil 628 while the remaining percentage, e.g., the remaining (100-A)%, is provided to bottom coil 630.

Current divider 638 effectively serves to regulate the percentage of current, i.e., current from amplifier 634, provided to top coil 628 and to bottom coil 630. When more current is provided to top coil 628 than to bottom coil 630, a push point associated with coil assembly 624 may effectively be moved upwards. Alternatively, when more current is provided to bottom coil 630 than to top coil 628, the push point associated with coil assembly 624 may effectively be moved downwards. While the current provided through current divider 638 may be divided, the associated voltage is effectively free to float.

In lieu of using current divider 638 to allow coil assembly 624 to be driven using a substantially single amplifier 634 and current divider 638, a voltage divider may instead be used to enable a substantially single amplifier to be used to drive a coil assembly. When a voltage divider is used, rather than having differences in current effectively define the differences in forces generated by coils within a coil assembly, differences in voltage may instead effectively define the differences in forces generated by coils within a coil assembly. With reference to FIG. 6c, the use of a voltage divider with a substantially single amplifier to drive coils of a coil assembly will be described in accordance with an embodiment of the present invention. A coil assembly 644, which includes a top coil 648 and a bottom coil 650, is driven by an amplifier 654 which effectively feeds a voltage divider 658. Voltage divider 658 divides a voltage provided by amplifier 654 such that a percentage of the total voltage provided by voltage divider 658 is provided as output 660a to top coil 648, while the remainder of the total voltage is provided as output 660b to bottom coil 650. Typically, when voltage divider 658 is used, voltage is divided while an amount of current provided to top coil 648 and an amount of current provided to bottom coil 650 are allowed to float.

Figure 7:
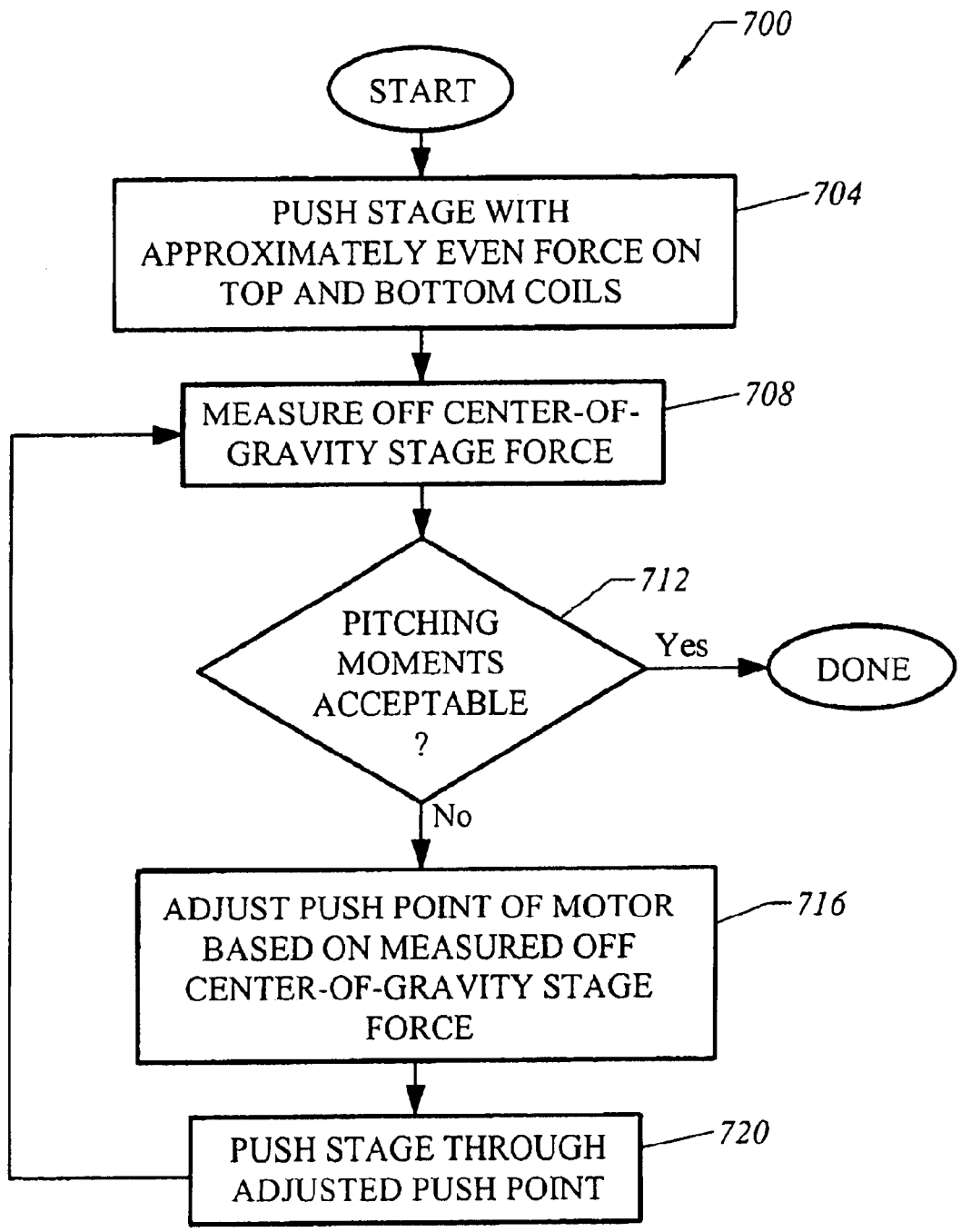
FIG. 7 is a process flow diagram which illustrates the steps associated with one method of utilizing a dual force actuator to adjust driving forces on a stage in accordance with an embodiment of the present invention.

Referring next to FIG. 7, the steps associated with one method of utilizing a dual force actuator to substantially adjust driving forces on a stage will be described in accordance with an embodiment of the present invention. A process 700 of using a dual force actuator begins at step 704 in which a stage is driven or otherwise pushed with approximately even force, e.g., approximately the same magnitude of force, on the top and bottom coils of a coil assembly. The off center-of-gravity stage force is then measured in step 708. In other words, the pitching motion of the stage or a stage base may be measured. To measure the pitching motion, many kinds of sensors may be used for such a purpose, e.g., an interferometer, an encoder, etc. may be used. As will be appreciated by those skilled in the art, a stage may generally be positioned substantially atop a flat stage base, e.g., an active vibration isolation system (AVIS) which is arranged to vibrationally isolate the stage. Either or both the stage and the stage base may be subjected to a pitching motion if the stage is not pushed through the center of gravity of the overall stage apparatus, i.e., if there is a significant off center-of-gravity stage force.

Once the off center-of-gravity stage force is measured, as for example by measuring the pitching motion of the stage or the base, it is determined in step 712 whether the pitching moments within the overall stage apparatus system are acceptable. In other words, it is determined whether the push point of the coil assembly or, more generally, the motor which includes the coil assembly, needs to be adjusted. If it is determined that the push point of the motor does not need to be adjusted, then the indication is that the off center-of-gravity stage force does not cause significant pitching motion within the overall stage assembly. As such, the process of adjusting driving forces on a stage is completed.

Alternatively, if the determination in step 712 is that the pitching moments within the overall stage assembly are unacceptable, then process flow proceeds to step 716 in which the push point of the motor is adjusted based on the measured off center-of-gravity stage force. That is, the difference between the relative forces associated with the top coil and the bottom coil of the coil assembly may be adjusted. By way of example, if the push point of the motor is to be adjusted upwards in order for the push point to better coincide with the center of gravity of the overall stage apparatus, then the difference between the force associated with the top coil and the force associated with the bottom coil may be biased such that a larger force is associated with the top coil than is associated with the bottom coil. In one embodiment, biasing the force towards the top coil may include providing a larger amplitude of current to the top coil.

After the push point of the motor is adjusted, the stage may be pushed through the new push point, or the adjusted push point, in step 720. As the adjustments made to the push point in step 716 is arranged to enable the push point of the motor to better coincide with the center of gravity of the overall stage apparatus, pushing the stage through the adjusted push point is effectively equivalent to substantially pushing the stage through the center of gravity of the overall stage apparatus. Once the stage is pushed through the new push point, process flow returns to step 708 in which the off center-of-gravity stage force is measured. From step 708, process flow proceeds to step 712 in which it is determined if the pitching moments are acceptable. If it is determined that the pitching moments are acceptable, then the process of adjusting driving forces on the stage is completed.

Figure 8A:
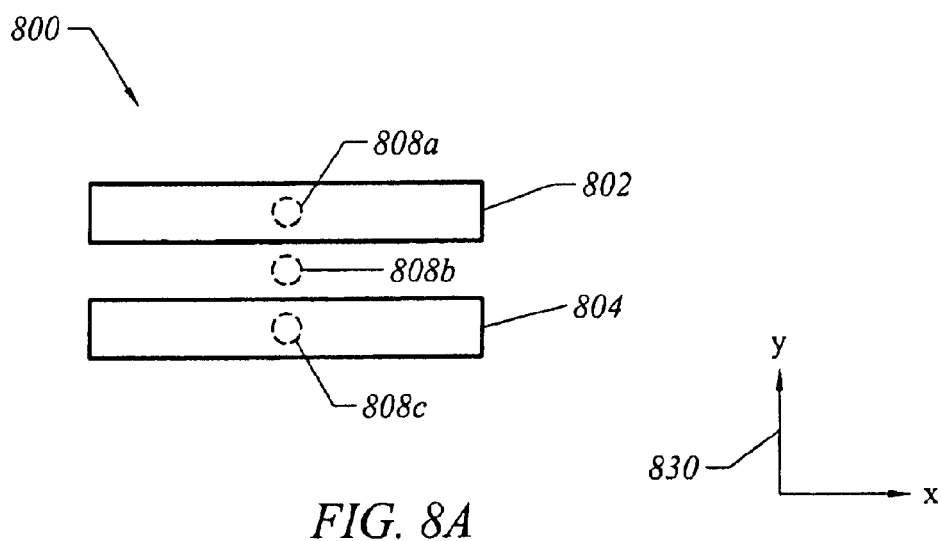
FIG. 8a is a diagrammatic block diagram representation of a top coil and a bottom coil of a coil assembly which are spaced apart in accordance with an embodiment of the present invention.

In general, although a dual force actuator has been described as including a top coil and a bottom coil which are substantially identical such that the top coil and the bottom coil may be commutated substantially identically, and are formed such that the top coil and the bottom coil are effectively not spaced apart, it should be appreciated that the top coil and the bottom coil may be spaced apart. A top coil and a bottom coil may be spaced apart when it is desired to increase the range by which the location of the push point may be adjusted. For example, if a top coil and a bottom coil which are not spaced apart enable a push point to be adjusted by up to approximately 10 mm, then to enable the push point to be adjusted by more than approximately 10 mm, the top coil and the bottom coil may be spaced apart. FIG. 8a is a diagrammatic block diagram representation of a top coil and a bottom coil of a coil assembly which are spaced apart in accordance with an embodiment of the present invention. A coil assembly 800 of a motor includes a top coil 802 and a bottom coil 804. Although top coil 802 and bottom coil 804 are typically substantially identical, top coil 802 and bottom coil 804 may also be different, e.g., may be of different sizes.

As shown, top coil 802 and bottom coil 804 are spaced apart. The distance by which top coil 802 and bottom coil 804 are spaced apart may vary widely. By way of example, top coil 802 may be spaced apart from bottom coil 804 by up to approximately 10 mm or more. When top coil 802 and bottom coil 804 are spaced apart and current is provided to top coil 802 while substantially no current is provided to bottom coil 804, then a center of force 808a or a push point associated with coil assembly 800 may be located in the middle of top coil 802 with respect to a y-axis 830, as shown. Alternatively, when current is provided to bottom coil 804 and substantially no current is provided to top coil 802, then a center of force 808c for coil assembly 800 may be located substantially in the middle of bottom coil 804 with respect to y-axis 830. In the event that substantially the same amplitude of current is provided to both top coil 802 and bottom coil 804, then a center of force 808b for coil assembly 800 may be positioned substantially between top coil 802 and bottom coil 804 with respect to y-axis 830.

Figure 8B:
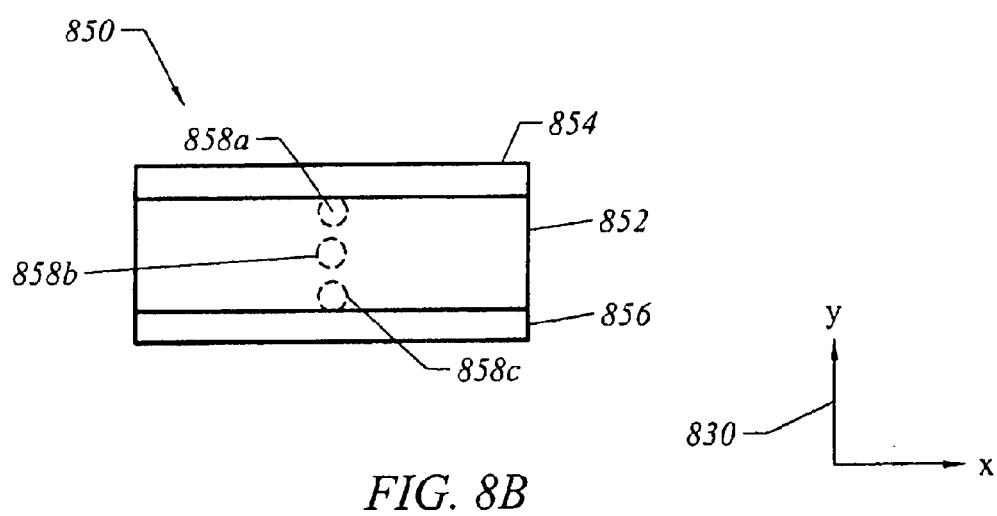
FIG. 8b is a diagrammatic block diagram representation of a coil assembly which includes three coils in accordance with an embodiment of the present invention.

In one embodiment, more than two coils may be included in the coil assembly of an actuator or a motor. By way of example, a coil assembly may include three coils. Referring next to FIG. 8b, a coil assembly which includes three coils will be described in accordance with an embodiment of the present invention. A coil assembly 850 of a motor includes a primary coil 852, a top coil 854, and a bottom coil 856. Primary (third) coil 852 may be arranged to generate force in the same direction of the force that is generated by top coil 854 and bottom coil 856. As shown, primary coil 852 is substantially larger than top coil 854 and bottom coil 856, which are substantially identical. It should be appreciated, however, the primary coil 852, top coil 854, and bottom coil 856 may be substantially identical or, alternatively, may each be different.

When primary coil 852 is substantially larger than top coil 854 and bottom coil 856, then primary coil 852 may be arranged to sustain the majority of force commanded to coil assembly 850. By adjusting the current provided to top coil 854 and to bottom coil 856 or, in one embodiment, by adjusting the voltage provided, a center of force may be adjusted substantially within primary coil 852 with respect to y-axis 830. For instance, if the relative force commanded to top coil 854 and to bottom coil 856 is substantially the same, then a center of force 858b may be located substantially in the center of primary coil 852, relative to y-axis 830. Alternatively, if the relative force commanded to top coil 854 is higher than the relative force commanded to bottom coil 856, then a center of force 858a may be moved upwards with respect to y-axis 830, and if the relative force commanded to bottom coil 856 is higher than the relative force commanded to top coil 854, then a center of force 858c may be moved downwards with respect to y-axis 830.

Figure 9:
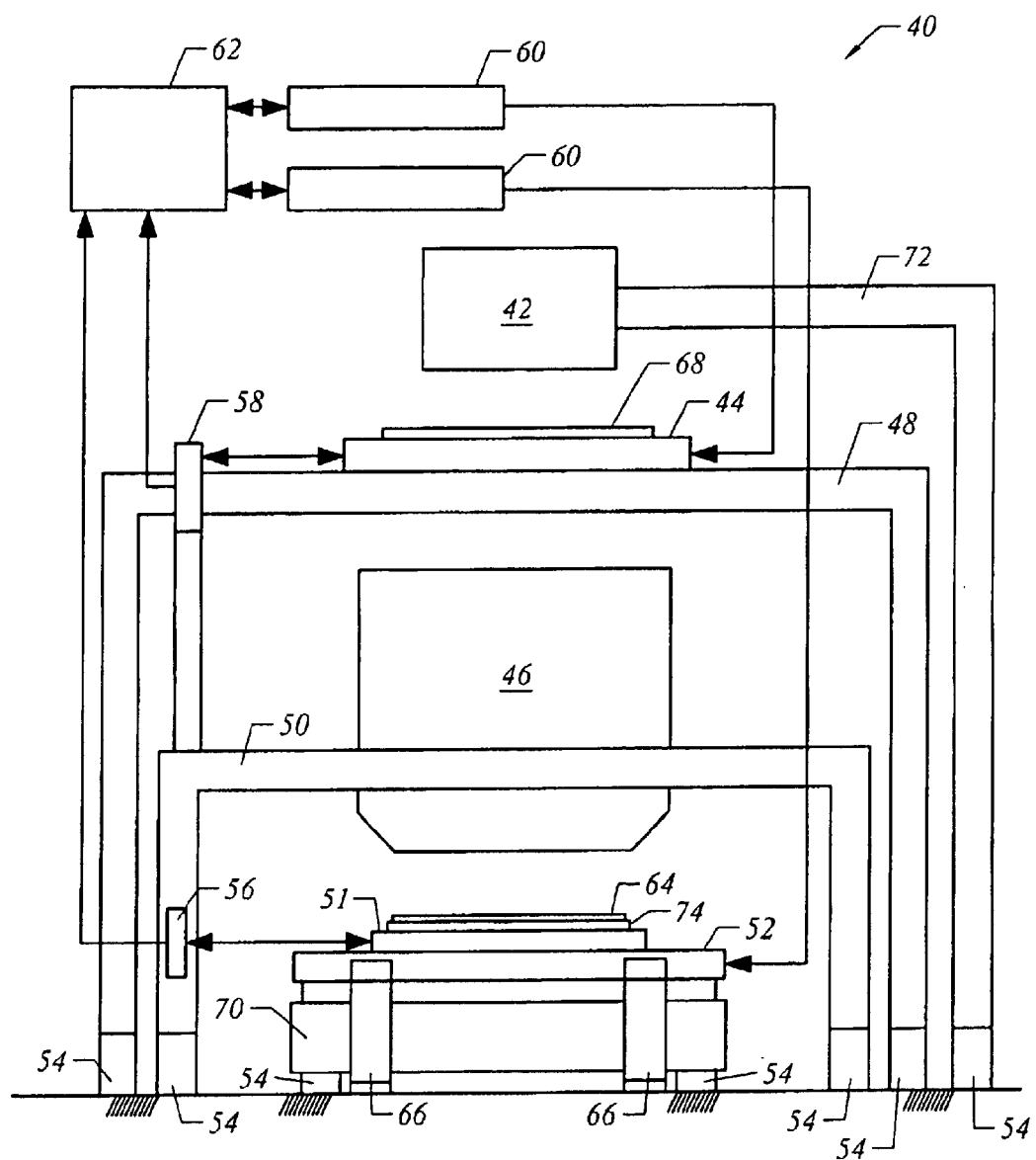
FIG. 9 is a diagrammatic representation of a photolithography apparatus in accordance with an embodiment of the present invention.

With reference to FIG. 9, a photolithography apparatus which may include a dual force actuator will be described in accordance with an embodiment of the present invention. A photolithography apparatus (exposure apparatus) 40 includes a wafer positioning stage 52 that may be constituted as the scanning stage device 300 shown in FIG. 3 and utilizes a linear motor (not shown) as an actuator for driving, as well as a wafer table 51 that is magnetically coupled to wafer positioning stage 52 by utilizing an EI-core actuator, e.g., an EI-core actuator with a top coil and a bottom coil which are substantially independently controlled. The linear motor which drives wafer positioning stage 52 uses an electromagnetic force generated by magnets and corresponding armature coils. In this case, the armature coils may be constituted as the coil assembly 200 shown in FIG. 2 to utilize the present invention. A wafer 64 is held in place on a wafer holder or chuck 74 which is coupled to wafer table 51. Wafer positioning stage 52 is arranged to move in multiple degrees of freedom, e.g., between three to six degrees of freedom, under the control of a control unit 60 and a system controller 62. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In the described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. In an alternate embodiment, reaction forces may be released to the floor or ground through a VCM or voice coil motor (not shown) that is substantially in contact with reaction frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage 44 which includes a coarse stage and a fine stage. The coarse stage and the fine stage may include a linear motor or a voice coil motor including the coil assembly 200 shown in FIG. 2 to utilize the present invention. The radiant energy is focused through projection optical system 46, which is supported on a projection optics frame 50 and may be supported the ground through isolators 54. Reticle stage 44 is supported on a reticle stage frame 48 and may be supported on the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62. Interferometers 56 and 58 may be utilized to measure the off center-of-gravity stage force (pitching motion or rolling motion) of wafer positioning stage 52 or reticle stage 44.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 10:
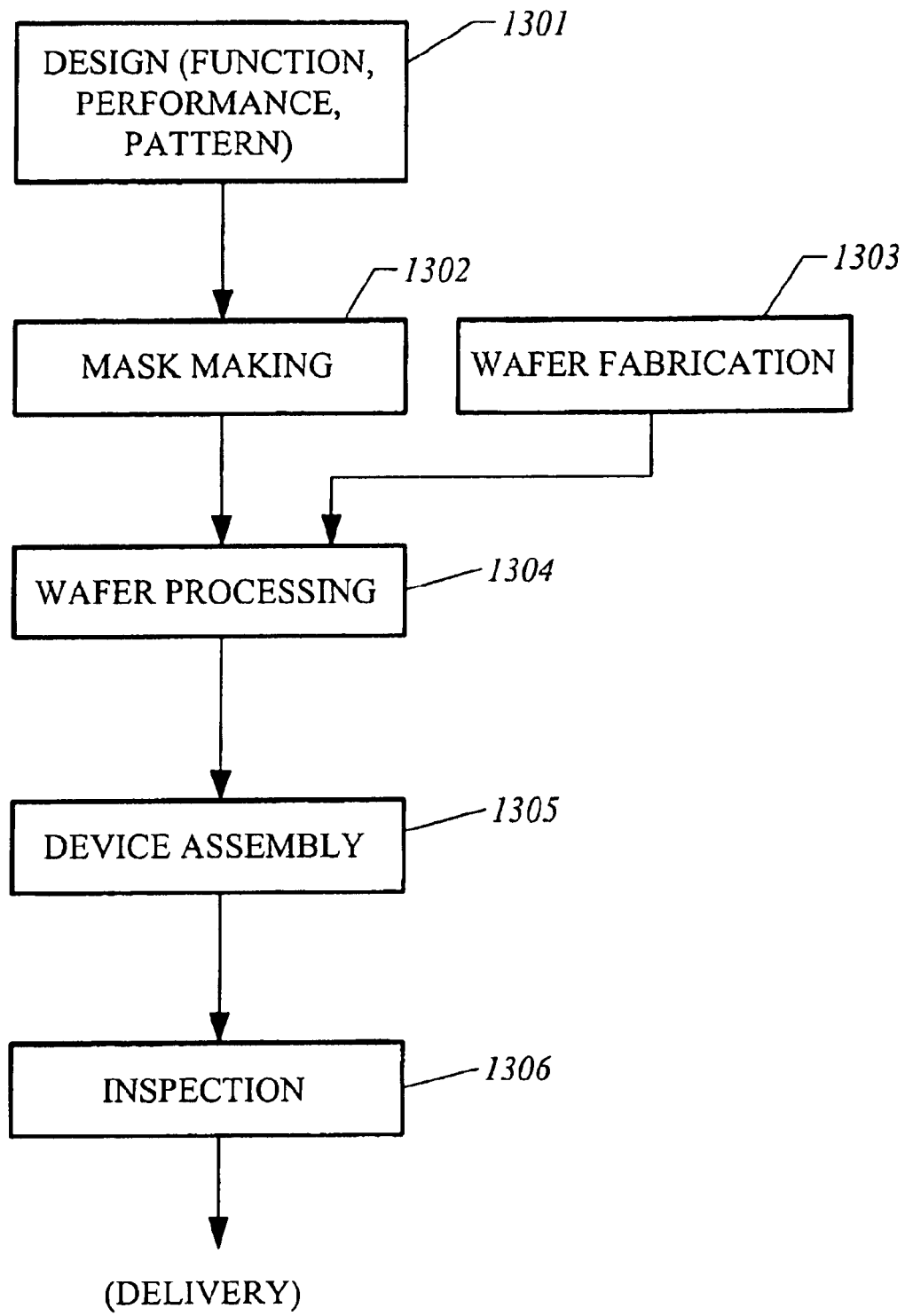
FIG. 10 is a process flow diagram which illustrates the steps associated with fabricating a semiconductor device in accordance with an embodiment of the present invention.

Further, semiconductor devices may be fabricated using systems described above, as will be discussed with reference to FIG. 10. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 11. In step 1305, the semiconductor device is assembled. The assembly of the semiconductor device generally includes, but is not limited to, wafer dicing processes, bonding processes, and packaging processes. Finally, the completed device is inspected in step 1306.

Figure 11:
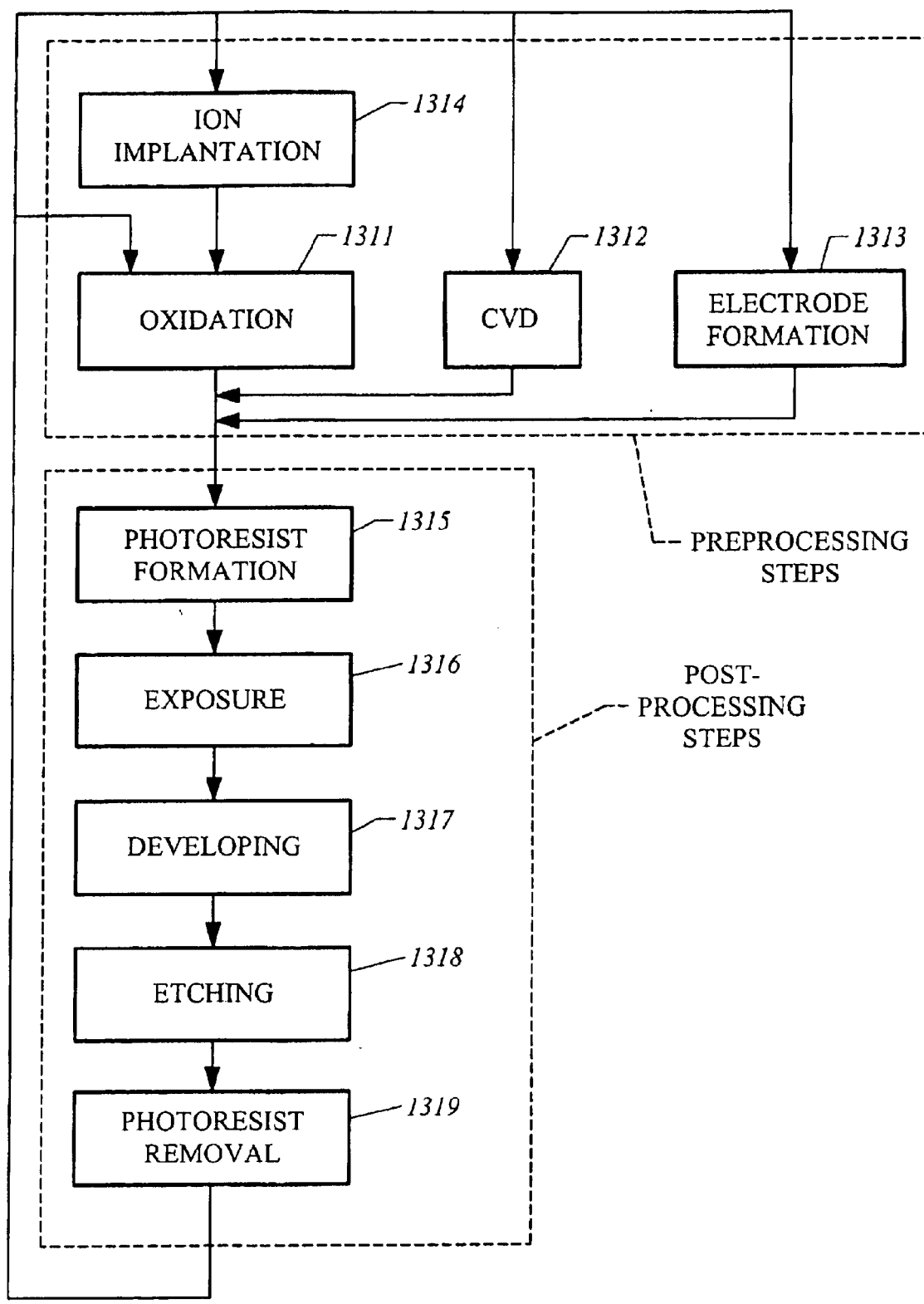
FIG. 11 is a process flow diagram which illustrates the steps associated with processing a wafer, i.e., step 1304 of FIG. 10, in accordance with an embodiment of the present invention.

FIG. 11 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle to the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, a coil assembly of a force actuator such as a motor has been described as having a top coil and a bottom coil. In general, two coils included in a coil assembly may not necessarily be oriented such that one coil is a top coil while the other coil is a bottom coil. Instead, the two coils may be arranged such that the two coils are situated side-by-side, e.g., as a "left" coil and a "right" coil.

While two coils included in a coil assembly have been described as being substantially identical to minimize the variation on back EMF and force constant, it should be appreciated that the coils may be different. In other words, the coils of a coil assembly are not necessarily identical, and are also not necessarily commutated identically.

A force actuator may include any number of coils, although a coil assembly of a force actuator has generally been described as including two coils. For instance, a coil assembly of a force actuator may include three coils as discussed above with respect to FIG. 8*b*. A coil assembly may even include more than three coils without departing from the spirit or the scope of the present invention.

When the amplitude of current provided to a first coil of a coil assembly is higher than the amplitude of current provided to a second coil of the coil assembly, the center of force of the coil assembly is typically biased towards the first coil. It should be understood, however, that in lieu of varying the relatively amplitudes of current provided to coils of a coil assembly, voltages provided to the coils may instead be varied to enable the center of force of the coil assembly to be shifted. In other words, rather than having coils which are controlled by current amplitudes, coils may instead be controlled by voltage magnitudes.

In general, the steps associated with the methods of the present invention may vary widely. Steps may be added, removed, altered, and reordered. By way of example, the off center-of-gravity stage force may be continuously monitored or measured such that the push point of a motor or actuator may be substantially dynamically adjusted as necessary. Therefore, the present examples are to be considered as illustrative and not restrictive, and the invention is not to be limited to the details given herein, but may be modified within the scope of the appended claims.

What is claimed is:

1. A method for scanning a stage device, the stage device including a stage and an actuator which includes a coil assembly with a first coil and a second coil, the method comprising:

driving the stage using the actuator, wherein the actuator is arranged to drive the stage through a push point associated with the first coil and the second coil, the first coil and the second coil being in physical contact to form a top half and a bottom half of the coil assembly;

determining when driving the stage using the actuator includes driving the stage through a first location associated with the stage; and altering the push point associated with the first coil and the second coil when it is determined that driving the stage using the actuator does not include driving the stage through the first location associated with the stage.

2. The method of claim 1 wherein driving the stage using the actuator includes:

providing a first input to the first coil; and providing a second input to the second coil, wherein a difference between the first input and the second input substantially defines the push point associated with the first coil and the second coil.

3. The method of claim 2 wherein altering the push point associated with the first coil and the second coil includes:

altering at least one of the first input and the second input to substantially adjust the difference between the first input and the second input.

4. The method of claim 3 wherein the first input is a first amplitude of current and the second input is a second amplitude of current.

5. The method of claim 3 wherein the first input is a first voltage and the second input is a second voltage.

6. The method of claim 1 wherein the first coil and the second coil are arranged to be individually controlled.

7. The method of claim 1 wherein the first location is an approximate center of gravity of the stage.

8. The method of claim 7 wherein altering the push point associated with the first coil and the second coil include adjusting the push point such that the push point and the first location are aligned along a common axis.

9. The method of claim 1 wherein the first location is an approximate center of rotation of the stage.

10. The method of claim 1 wherein determining when driving the stage using the actuator includes measuring pitching moments associated with driving the stage.

11. A method for operating an exposure apparatus comprising the method for scanning of claim 1.

12. A method for making an object including at least a photolithography process, wherein the photolithography process utilizes the method of operating an exposure apparatus of claim 11.

13. A method for making a wafer utilizing the method of operating an exposure apparatus of claim 11.

14. A stage apparatus comprising:

a stage, the stage having a center-of-gravity; and an actuator, the actuator including a first coil and a second coil, the first coil and the second coil being in physical contact and being arranged to be substantially separately controllable, wherein the first coil and the second coil cooperate to define a center of force through which the stage is arranged to be driven by the actuator.

15. The stage apparatus of claim 14 wherein the first coil includes a first input and the second coil includes a second input, the first input and the second input being arranged to be adjusted to substantially move the center of force.

16. The stage apparatus of claim 14 wherein the first coil includes a first input and the second coil includes a second input, the first input and the second input being arranged to be adjusted to substantially move the center of force to be approximately aligned along a common plane with the center of gravity.

17. The stage apparatus of claim 14 wherein the first coil includes a first input and the second coil includes a second input, the first input and the second input being arranged to be adjusted to substantially move the center of force to be approximately aligned along a common plane with a center of rotation.

18. The stage apparatus of claim 14 wherein a first force associated with first coil and a second force associated with the second coil are adjustable to adjust the center of force.

19. The stage apparatus of claim 14 wherein the first coil and the second coil are arranged to be commutated substantially identically.

20. The stage apparatus of claim 14 further including:
a control source, the control source being arranged to control the first coil and the second coil substantially individually.

21. The stage apparatus of claim 20 wherein the control source is arranged to control the first coil and the second coil to substantially shift the center of force to be aligned with the center-of-gravity along a first axis.

22. The stage apparatus of claim 20 wherein the control source is arranged to control the first coil and the second coil to substantially shift the center of force to be aligned with a center of rotation along a first axis.

23. The stage apparatus of claim 20 wherein the control source includes a first amplifier coupled to the first coil and a second amplifier coupled to the second coil.

24. The stage apparatus of claim 20 wherein the control source includes an amplifier and a current divider, the current divider having a first output and a second output, the first output being coupled to the first coil and the second output being coupled to the second coil.

25. The stage apparatus of claim 20 wherein the control source includes an amplifier and a voltage divider, the voltage divider having a first output and a second output, the first output being coupled to the first coil and the second output being coupled to the second coil.

26. The stage apparatus of claim 14 wherein the actuator is one of a voice coil motor and a linear motor.

27. An exposure apparatus comprising the stage apparatus of claim 14.

28. A device manufactured with the exposure apparatus of claim 27.

29. A wafer on which an image has been formed by the exposure apparatus of claim 27.

30. The stage apparatus of claim 14 wherein the actuator includes a third coil, the third coil being arranged to generate force in a same direction of a force that is generated by at least one of the first coil and the second coil.

31. A stage apparatus comprising:
a stage, the stage having a center-of-gravity; and
an actuator, the actuator including a first coil, a second coil, and a third coil, the first coil and the second coil being arranged to be substantially separately controllable, the third coil being arranged to generate force in a same direction of a force that is generated by at least one of the first coil and the second coil, wherein the first coil and the second coil cooperate to define a center of force through which the stage is arranged to be driven by the actuator and wherein the third coil is arranged to sustain a majority of the force of the actuator.

32. An actuator comprising:
a magnet; and
a coil assembly, the coil assembly including a first coil and a second coil, the first coil and the second coil being in physical contact, the first coil being arranged to be controlled to adjust a first amount of force associated with the first coil, the second coil being arranged to be controlled to adjust a second amount of force associated with the second coil, the first amount of force and the second amount of force being arranged to cooperate to substantially define a push point of the actuator, wherein the magnet and the coil assembly are arranged to cooperate to cause the actuator to actuate.

33. The actuator of claim 32 further including:
a first controller, the first controller being arranged to adjust the first amount of force; and
a second controller, the second controller being arranged to adjust the second amount of force, wherein the first amount of force and the second amount of force are arranged to be adjusted to adjust the push point of the actuator.

34. The actuator of claim 33 wherein a difference between the first amount of force and the second amount of force substantially defines a relative force, the relative force being arranged to substantially determine a location of the push point.

35. The actuator of claim 34 wherein the difference is adjustable using at least one of the first controller and the second controller to alter the relative force and the location of the push point.

36. The actuator of claim 33 further including:
an amplifier; and
a current divider coupled to the amplifier, wherein the first controller and the second controller are individually coupled to outputs of the current divider.

37. The actuator of claim 33 further including:
an amplifier; and
a voltage divider coupled to the amplifier, wherein the first controller and the second controller are individually coupled to outputs of the voltage divider.

38. The actuator of claim 32 wherein the coil assembly includes more than the first coil and the second coil.

39. A stage apparatus comprising the actuator of claim 32.

40. An exposure apparatus comprising the stage apparatus of claim 39.

41. A device manufactured with the exposure apparatus of claim 40.

42. A wafer on which an image has been formed by the exposure apparatus of claim 40.

43. The actuator of claim 32 wherein the coil assembly includes a third coil, the third coil being arranged to generate a force in a same direction of a force that is generated by at least one of the first coil and the second coil.

44. An actuator comprising:
a magnet; and
a coil assembly, the coil assembly including a first coil, a second coil, and a third coil, the first coil being arranged to be controlled to adjust a first amount of force associated with the first coil, the second coil being arranged to be controlled to adjust a second amount of force associated with the second coil, the third coil being arranged to generate a force in a same direction of a force that is generated by at least one of the first coil and the second coil, the first amount of force and the second amount of force being arranged to cooperate to substantially define a push point of the actuator, wherein the magnet and the coil assembly are arranged to cooperate to cause the actuator to actuate and wherein the third coil is arranged to sustain a majority of the force of the actuator.

45. A method for scanning a stage device, the stage device including a stage and an actuator, the method comprising:
driving the stage using the actuator, wherein the actuator is arranged to drive the stage through a center of force associated with the actuator, the actuator including a first coil and a second coil that are in physical contact;

determining when driving the stage using the actuator includes driving the stage through a center-of-gravity associated with the stage; and altering the center of force associated with the actuator when it is determined that driving the stage using the actuator does not include driving the stage through the center-of-gravity associated with the stage.

46. The method of claim 45 wherein altering the center of force associated with the actuator includes altering at least one of a first force associated with the first coil and a second force associated with the second coil.

47. The method of claim 46 wherein altering the at least one of the first force and the second force adjust the relative force of the actuator to substantially alter the center of force.

48. A method for operating an exposure apparatus comprising the method for scanning of claim 45.

49. A method for making an object including at least a photolithography process, wherein the photolithography process utilizes the method of operating an exposure apparatus of claim 48.

50. A method for making a wafer utilizing the method of operating an exposure apparatus of claim 48.

51. The method of claim 45 wherein the actuator includes at least a first coil and a second coil, and altering the center of force associated with the actuator includes altering at least one of a first force associated with the first coil and a second force associated with the second coil.

52. A method for scanning a stage device, the stage device including a stage and an actuator which includes a coil assembly with a first coil, a second coil, and a magnet assembly, the method comprising:

driving the stage using the actuator, wherein the actuator is arranged to drive the stage through a push point associated with the first coil and the second coil, each of the first coil and the second coil being arranged to generate an electromagnetic force by cooperating with the magnet assembly that is common to the first coil and the second coil;

determining when driving the stage using the actuator includes driving the stage through a first location associated with the stage; and altering the push point associated with the first coil and the second coil when it is determined that driving the stage using the actuator does not include driving the stage through the first location associated with the stage.

53. A method stage device comprising:

a stage, the stage having a center-of-gravity; and an actuator, the actuator including a magnet assembly, a first coil, and a second coil, each of the first coil and the second coil being arranged to generate an electromagnetic force by cooperating with the magnet assembly that is common to the first coil and the second coil and being arranged to be substantially separately controllable, wherein the first coil and the second coil cooperate to define a center of force through which the stage is arranged to be driven by the actuator.

54. An actuator comprising:

a magnet assembly; and a coil assembly, the coil assembly including a first coil and a second coil, the first coil being arranged to be controllable to adjust a first amount of force associated with the first coil, the second coil being arranged to be controllable to adjust a second amount of force associated with the second coil, the first amount of force and the second amount of force being arranged to cooperate to substantially define a push point of the actuator, wherein the magnet assembly and the coil assembly are arranged to cooperate to cause the actuator to actuate and each of the first coil and the second coil generates an electromagnetic force by cooperating with the magnet assembly that is common to the first coil and the second coil.

55. A method for scanning a stage device, the stage device including a stage and an actuator, the method comprising:

driving the stage using the actuator, wherein the actuator is arranged to drive the stage through a center of force associated with the actuator, the actuator including a magnet assembly, a first coil, and a second coil, and each of the first coil and the second coil is arranged to generate a force by cooperating with the magnet assembly that is common to the first coil and the second coil;

determining when driving the stage using the actuator includes driving the stage through a center-of-gravity associated with the stage; and altering the center of force associated with the actuator when it is determined that driving the stage using the actuator does not include driving the stage through the center-of-gravity associated with the stage.

* * * * *